United States Patent
Fischer et al.

(10) Patent No.: US 9,059,273 B2
(45) Date of Patent: Jun. 16, 2015

(54) METHODS FOR PROCESSING A SEMICONDUCTOR WAFER

(71) Applicant: Infineon Technologies AG, Neubiberg (DE)

(72) Inventors: Petra Fischer, Wernberg (AT); Michael Roesner, Villach (AT); Gudrun Stranzl, Goedersdorf (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 14/014,699

(22) Filed: Aug. 30, 2013

(65) Prior Publication Data
US 2015/0064877 A1    Mar. 5, 2015

(51) Int. Cl.
*H01L 21/00*     (2006.01)
*H01L 21/78*     (2006.01)

(52) U.S. Cl.
CPC ....... *H01L 21/78* (2013.01); *H01L 2224/03001* (2013.01); *H01L 2223/54453* (2013.01); *H01L 2223/5446* (2013.01)

(58) Field of Classification Search
CPC ............ H01L 2223/54443; H01L 2223/5446; H01L 2224/03001; H01L 21/78
USPC .................................................. 438/460–465
See application file for complete search history.

(56) References Cited

U.S. PATENT DOCUMENTS

| | | | |
|---|---|---|---|
| 2003/0089997 A1* | 5/2003 | Mergenthaler et al. | 257/774 |
| 2003/0202181 A1* | 10/2003 | Maltabes et al. | 356/401 |
| 2008/0286938 A1* | 11/2008 | Pu et al. | 438/458 |
| 2012/0126228 A1* | 5/2012 | Fischer et al. | 257/48 |

* cited by examiner

*Primary Examiner* — Karen Kusumakar

(57) ABSTRACT

A method for processing a semiconductor wafer in accordance with various embodiments may include: providing a semiconductor wafer including at least one chip and at least one kerf region adjacent to the at least one chip, the kerf region including at least one auxiliary structure; applying a mask layer to the semiconductor wafer; removing the at least one auxiliary structure in the at least one kerf region; removing the applied mask layer; and separating the semiconductor wafer along the at least one kerf region.

25 Claims, 6 Drawing Sheets

METHODS FOR PROCESSING A SEMICONDUCTOR WAFER

TECHNICAL FIELD

Various embodiments relate to methods for processing a semiconductor wafer.

BACKGROUND

In various semiconductor manufacturing processes, semiconductor wafers are separated into individual or singulated integrated circuit chips. Wafer or chip separation processes can occur in kerf regions. The kerf regions may contain various auxiliary structures, such as, for example, process control monitor (PCM) structures, lithographic structures, alignment structures, metal pads, contacts, etc. Separating a semiconductor wafer along the kerf regions having auxiliary structures can cause undesirable effects such as sidewall chipping, dicing tool abrasive wear, etc. Therefore methods for enabling chip separation without the aforementioned negative consequences may be desirable.

SUMMARY

A method for processing a semiconductor wafer in accordance with one or more exemplary embodiments may include: providing a semiconductor wafer including at least one chip and at least one kerf region adjacent to the at least one chip, the kerf region including at least one auxiliary structure; applying a mask layer to the semiconductor wafer; removing the at least one auxiliary structure in the at least one kerf region; and separating the semiconductor wafer along the at least one kerf region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
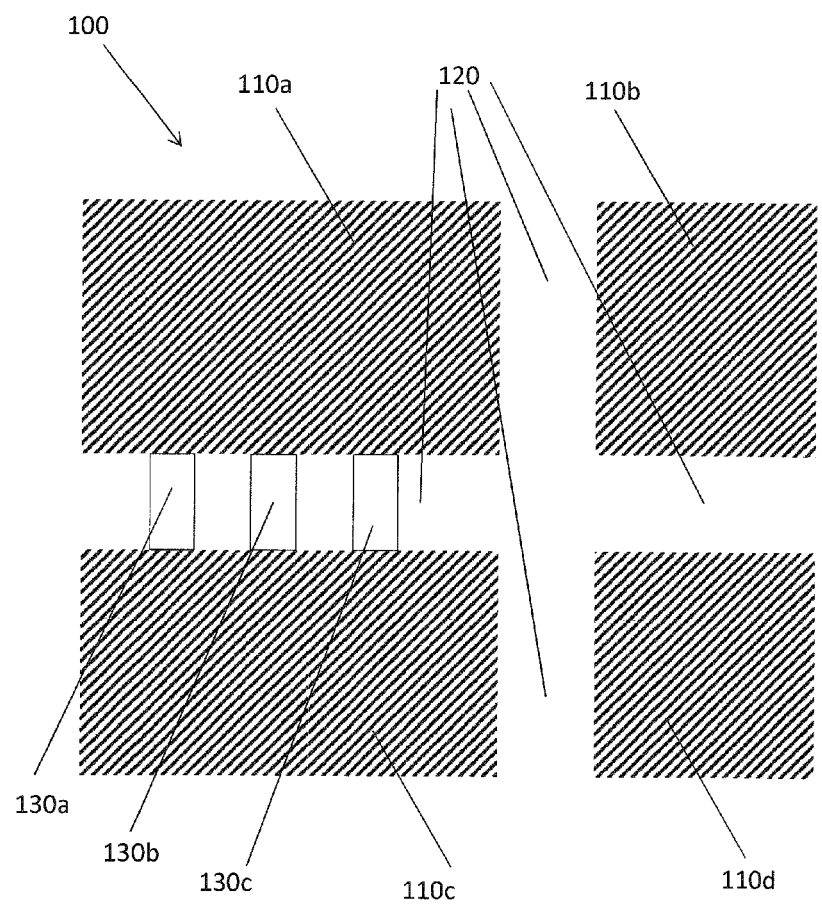
FIG. 1 shows a section of an exemplary semiconductor wafer in accordance with various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer, "over" a side or surface, may be used to mean that the feature, e.g. the layer, may be formed "directly on", e.g. in direct contact with, the implied side or surface. The word "over", used herein to describe forming a feature, e.g. a layer, "over" a side or surface, may be used to mean that the feature, e.g. the layer, may be formed "indirectly on" the implied side or surface with one or more additional layers being arranged between the implied side or surface and the formed layer.

The term "connection" may include both an indirect "connection" and a direct "connection".

In various semiconductor manufacturing processes, semiconductor wafers may be produced that have active regions. An active region can include an integrated circuit chip. These semiconductor wafers can be separated or singulated to produce individual integrated circuit chips. Chip separation processes can occur along or in kerf regions to separate the semiconductor wafer. Kerf regions may be located adjacent to and/or between the active regions. The kerf regions may include auxiliary structures. In one or more embodiments, the term "auxiliary structure" may refer to a structure formed during the processing of a semiconductor wafer that does not interact with or affect the active structures of the processed semiconductor wafer (e.g., integrated circuit chips of the semiconductor wafer) and/or that may be used to evaluate the manufacturing process of a semiconductor device. Examples of auxiliary structures can include, for example, process control monitor (PCM) devices, lithographic structures, metal pads, contacts for electrochemical etching, and alignment structures, to name a few.

The presence of auxiliary structures in the kerf regions during chip separation can cause unwanted effects, such as abrasive wear or damage to dicing tools, severe side wall chipping, and/or other damage or degradation to a semiconductor wafer. Furthermore, certain chip separation techniques or processes may not be effective or capable of being implemented when auxiliary structures are present in the kerf regions.

Known methods for removing auxiliary structures from kerf regions can include mechanical and/or laser cuts that penetrate a shallow or limited depth of the semiconductor wafer material. These techniques are not damage free and can cause mechanical stress to the semiconductor wafer, and produce micro cracks to the wafer. These micro cracks can further propagate and produce sidewall chipping and large sidewall cracks.

In some cases drop-in chips may be used for testing or evaluation purposes in lieu of auxiliary structures in the kerf regions. The drop-in chips can be used for testing purposes before separating (e.g., dicing) the wafer and then can be discarded after chip separation. However such drop-in chips require large area of the wafer which reduces the amount of active wafer area. In other words, when drop-in chips are used, the area available in a semiconductor wafer for functional chips is smaller. Thus lower yields may result.

Auxiliary structures located in kerf regions may include, for example, process control monitor (PCM) devices, lithographic structures, metal pads, contacts (e.g., contacts for electrochemical etching), and alignment structures, to name a few. In embodiments, kerf auxiliary structures may include at least two different layers, consisting of materials such as metal, oxide, carbon, silicon, poly-silicon, and nitride, to name a few.

In accordance with exemplary embodiments, a semiconductor wafer can be a silicon wafer, or may be a semiconductor wafer consisting of semiconductor materials other than silicon, including IV-IV, III-V and II-VI compound semiconductor materials, for example germanium, silicon germanium, silicon carbide, gallium arsenide, gallium nitride, indium arsenide, indium gallium arsenide, or the like, may be used as well.

In accordance with exemplary embodiments, removing auxiliary structures from kerf regions of a semiconductor wafer may be achieved by wet or dry etching. Etching may substantially and/or completely remove the various layers constituting the kerf auxiliary structures. Wet chemical and/or dry etching can include the use of a mask or mask layer. The mask layer can be applied to the semiconductor wafer to protect the active regions (e.g., the integrated circuit chips). The mask layer can be made of materials such as nitride (e.g., plasma nitride), oxide (e.g., a plasma oxide), carbide, metal or metal alloy, adhesive film/tape, and the like. The mask layer may also be a positive or negative photoresist e.g., a spray resist.

Various embodiments disclosed herein relate to methods for processing a semiconductor wafer or workpiece that includes one or more integrated circuit chips with adjacent kerf regions having auxiliary structures. Various embodiments, relate to methods for removing kerf structures from semiconductor wafers.

The various embodiments can include methods for damage free, or substantially damage-free removal, of auxiliary kerf structures prior to chip separation.

FIG. 1 shows a top view of a simplified representation of a section of a processed semiconductor wafer 100 in accordance with exemplary embodiments. The wafer 100 may include or may be made of any semiconductor material, such as silicon, or may contain semiconductor materials other than silicon, including IV-IV, III-V and II-VI compound semiconductor materials, for example germanium, silicon germanium, silicon carbide, gallium arsenide, gallium nitride, indium arsenide, indium gallium arsenide, or the like, may be used as well.

As shown in FIG. 1, the wafer 100 includes a plurality of chips designated 110a, 110b, 110c, 110d, and also referred to collectively as chips 110. The chips 110 are located in active regions and may be any type or kind of integrated circuit manufactured according to any suitable semiconductor manufacturing processes.

In FIG. 1, the wafer 100 contains kerf regions 120 that are located alongside and/or adjacent to the chips 110. Chip separation can be performed in or along the kerf regions 120. The kerf regions 120 may serve to provide adequate separation between the chips 110 during previous or subsequent semiconductor manufacturing processes. As shown in FIG. 1, a plurality of auxiliary structures, designated 130a, 130b, 130c, (collectively designated as auxiliary structures 130) are located in the kerf regions 120. The auxiliary structures 130 may include structures used for testing or evaluation purposes such as, for example, process control monitor (PCM) structures. Other auxiliary structures that may be in the kerf region include lithographic structures, alignment structures, metal pads, and contacts, to name a few.

In accordance with exemplary embodiments, the auxiliary structures can include a plurality of layers which are disposed in the kerf region of a semiconductor wafer. For example, such layers may contain or consist of any type of material, such as, for example, metals, oxides, semiconductors, nitrides, carbon, poly-silicon, to name a few.

In FIG. 1, while the shapes of the processed semiconductor wafer section 100 and other components are generally depicted as rectangular-like, this is merely exemplary as other configurations, arrangements, shapes, etc. may be implemented with respect to a wafer. For example, semiconductor wafers referenced described herein can have semiconductor chips with curved or circular-like shapes (e.g., circle, oval, etc.), polygonal-like shapes (e.g., quadrilateral, pentagonal, hexagonal), and the like, to name a few.

Figure 2:
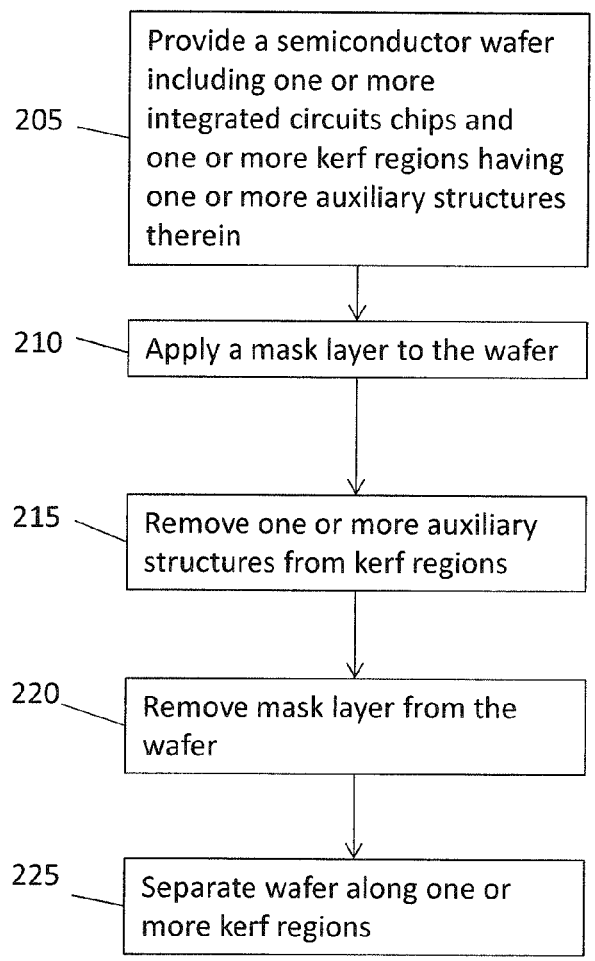
FIG. 2 shows a method for processing a semiconductor wafer in accordance with various embodiments.
Figure 3A:
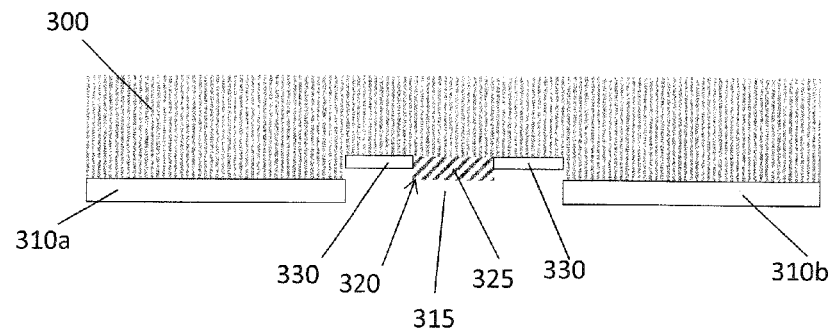
FIG. 3A-3E shows partial cross-sectional views a semiconductor wafer in accordance with various embodiments.

FIG. 2 shows an exemplary method for processing a semiconductor wafer in accordance with various embodiments. At step 205, a semiconductor wafer is provided which includes at least one integrated circuit chip and at least one kerf region, with the at least one kerf region having at least one auxiliary structure. For example, such a semiconductor wafer can be similar to the semiconductor wafer 100 depicted in FIG. 1. In another example, the embodiment of FIG. 3A shows a cross-sectional side view representation of a processed semiconductor wafer 300. The semiconductor wafer 300 may be of any suitable semiconductor material, such as a silicon wafer, or wafers containing or consisting of other semiconductor materials than silicon, including IV-IV, III-V and II-VI compound semiconductor materials, for example germanium, silicon germanium, silicon carbide, gallium arsenide, gallium nitride, indium arsenide, indium gallium arsenide, or the like, may be used as well.

In accordance with exemplary embodiments, kerf auxiliary structures may include at least two different layers. For example, in the embodiment of FIG. 3A, active regions 310a and 310b of the wafer 300 are separated by a kerf region 315. The active regions, collectively designated as active regions 310, may each include an integrated circuit chip.

The kerf region 315 in FIG. 3A contains an auxiliary structure 320 having a metal layer 325 and an oxide layer 330. The auxiliary structure 320 is exemplary, as other various auxiliary structures may be realized, e.g., auxiliary structures having different layers, materials, and configurations, etc. The auxiliary structure 320 may represent a plurality of auxiliary structures located in the kerf region 315.

Referring back to FIG. 2, at step 210, a mask layer can be applied to the provided wafer. In embodiments, a front side and/or back side of the wafer, for example a front side with one or more exposed active regions or integrated circuit chips, can be covered by the mask layer.

The mask layer can be, for example, a hard mask, photoresist, and the like, to name a few.

In some embodiments, the mask layer may be applied over a whole wafer area, such as, for example, over the entire front and/or back side of the wafer. The mask layer may be applied and/or formed by a spin coating process.

Figure 3B:
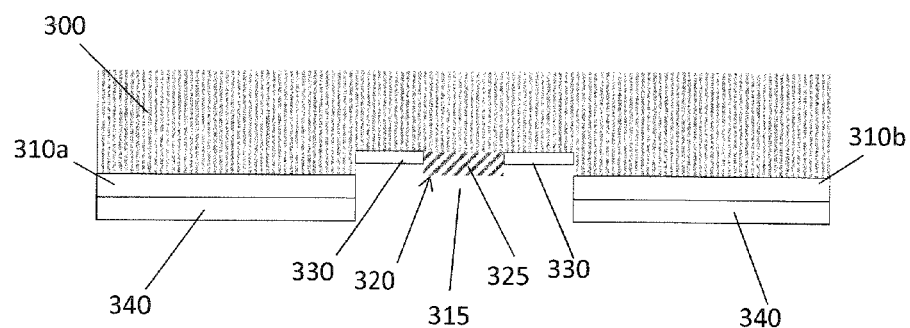

In embodiments, the mask layer can be applied in a local manner, for example over the chip or active regions of the wafer. For example, the mask layer can be applied or formed so as to cover chips or active regions but not cover or enter kerf regions, such as, in one example, by means of deposition and subsequent patterning, e.g., photo-patterning of a mask material (e.g., photoresist). The mask layer can also be formed locally over the chips by spray coating masking material on the active regions. For example, as shown in the embodiment of FIG. 3B, the wafer 300 includes a mask layer 340 disposed on or over the active regions 310. The mask layer 340 may not cover or enter the kerf region 320. The mask layer 340 can protect the active regions 310, such as during removal of the auxiliary structure 320.

Referring back to FIG. 2, after covering the wafer with a mask layer, at step 215, the one or more auxiliary structures are removed. In accordance with exemplary embodiments, the one or more auxiliary structures can be removed with at most negligible damage to the semiconductor wafer, e.g., without damage or with at most negligible damage to the semiconductor material of the wafer adjacent to the removed auxiliary structure. In embodiments, the auxiliary structures may be removed by removing the layers constituting the auxiliary structures. The layers of auxiliary structures may be removed in any suitable or appropriate order, including removing one or more layers, or sections thereof simultaneously.

Figure 3C:
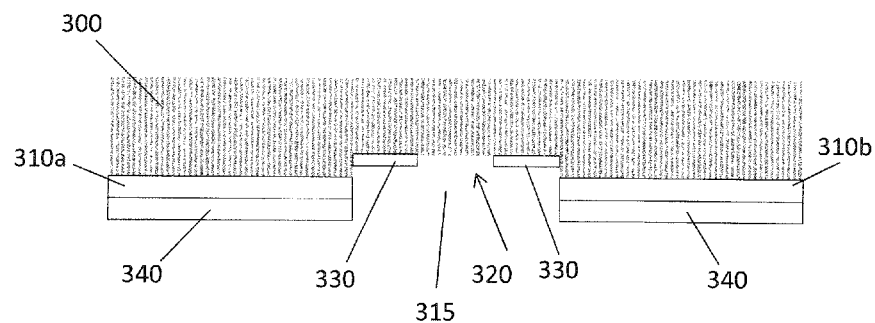
Figure 3D:
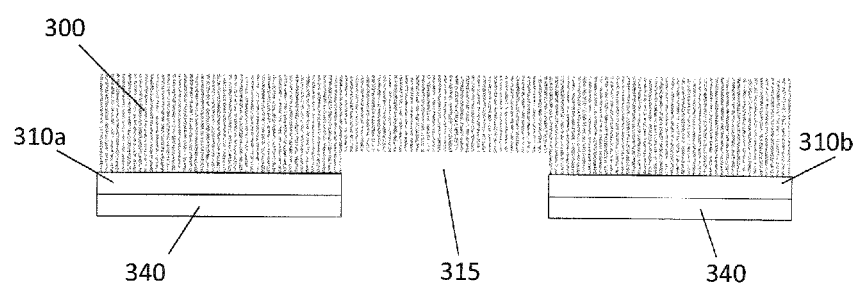

As shown in the embodiment of FIG. 3C, the metal layer 325 of the auxiliary structure 320 has been removed while in the embodiment of FIG. 3D the oxide layer 330 is subsequently removed. In another embodiment, the oxide layer 330 may be removed prior to the metal layer 325.

In an exemplary embodiment a kerf auxiliary structure can be removed through an etching process. In etching away one or more layers of a kerf auxiliary structure, a suitable etch mask material or etch mask system may be used. As previously disclosed the mask layer or mask material may include, for example, a positive or negative photoresist (e.g. spray resist), or a hardmask material such as, for example, nitride (e.g. plasma nitride), oxide (e.g. plasma oxide), carbide, metal or metal alloy, adhesive film or tape, and the like.

In exemplary embodiments, a wet etching process, a dry etching process, or a combination of dry and wet etching processes may be used to remove the layers of the auxiliary structures located in the kerf regions. In embodiments, the particular type of etching or layer removal technique implemented may be dependent on the type of materials constituting the kerf auxiliary structures. Thus the techniques implemented to remove the one or more layers forming the auxiliary structures can vary as the auxiliary structures vary. For example, referring to FIG. 3B-3D, a wet chemical etching may be applied to first remove the metal layer 325, and may be also applied to remove the oxide layer 330. In another example, one type of etching, for example, wet chemical etching could be applied to a first layer (e.g., metal layer 325 of auxiliary structure 320), while a second or different type of etching, for example, dry chemical etching, could then be applied to a second layer (e.g., oxide layer 330 of wafer 300).

Figure 3E:
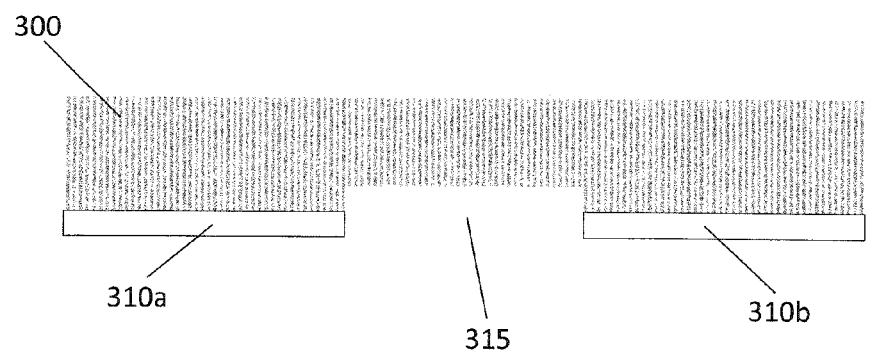
Figure 4:
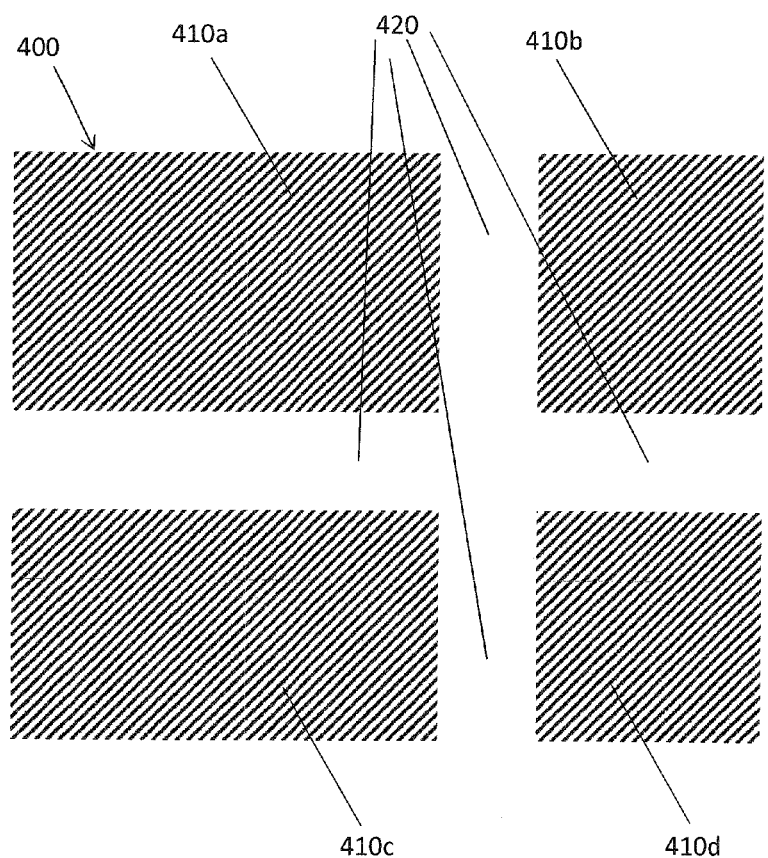
FIG. 4 shows a section of an exemplary semiconductor wafer in accordance with various embodiments.

After removing the one or more auxiliary structures from the kerf regions, at step 220, the mask layer can be removed using any suitable technique. The result is a processed semiconductor wafer free of auxiliary structures in the kerf regions. For example, the embodiment of FIG. 3E depicts the kerf region 315 without any auxiliary structures. Additionally, the active regions 310 are no longer covered by the mask layer 340. The exemplary embodiment of FIG. 4 shows a top view representation of a semiconductor wafer section 400 in which the kerf auxiliary structures have been removed. The wafer 400 is similar to wafer 100 of FIG. 1. However, kerf sections 420 of wafer 400 have no auxiliary structures, unlike wafer 100 which has the kerf auxiliary structures 130a, 130b, 130c. In other words, the wafer 100 may be processed in accordance with embodiments disclosed herein with the result being the wafer 400.

In accordance with exemplary embodiments the wafer section 400 may be further processed, and for example, subjected to chip separation (e.g., dicing) or other processes.

Referring back to FIG. 2, at 225, the semiconductor wafer can be separated or diced along the kerf regions using any suitable technique. The semiconductor wafer can be separated to form at least one singulated or individual integrated circuit chip. The singulated integrated circuit chip can thereafter be mounted and packaged in any suitable manner.

In accordance with exemplary embodiments, the separation of the semiconductor wafer can be performed by dicing the wafer along the kerf regions of the semiconductor wafer. Various dicing methods may be implemented such as, for example, plasma etching the kerf region, irradiating the kerf region with a laser, sawing the kerf region with a tool (e.g., a saw), stealth dicing the kerf region, and/or any other suitable separation method.

In exemplary embodiments, wafer separation, e.g., dicing, can be applied to the semiconductor wafer from any suitable orientation, direction, angle, etc. For example, in the case of sawing, the semiconductor wafer can be sawed from a front side and/or a back side of the semiconductor wafer, from any suitable angle or direction.

In an exemplary embodiment, the removal of kerf auxiliary structures can occur from the front side of the semiconductor wafer, and the wafer separation or dicing can occur from the front side and/or from the back side of the wafer.

In some exemplary embodiments, the semiconductor wafer can be separated or diced prior to and/or subsequent to the removal of kerf auxiliary structures. For example, a mask layer can be applied to the back side of the semiconductor wafer, and then a dicing technique can be applied to, for example, the back side. In this regard, back side of the semiconductor may be diced only so far as just before or below the kerf auxiliary structure(s). In other words, the wafer can be diced along the kerf regions from the backside without affecting or damaging the kerf auxiliary structures. After dicing, the kerf auxiliary structures can be removed from the front side in accordance with embodiments described herein.

Without being bound by theory, the damage-free removal of the auxiliary structures from the kerf regions of a semiconductor wafer according to the embodiments described herein can allow for almost any chip separation method to be utilized on the semiconductor wafer. For example, if auxiliary structures remain in the kerf regions, particular dicing methods, such as stealth dicing, which requires a metal-free kerf, may not be capable of being performed on the semiconductor wafer in order to achieve proper chip separation.

Another effect of the damage-free removal of auxiliary structures may be reduction of abrasive wear on tools used in chip separation processes. For example, when mechanical dicing is employed as a chip separation method, there may be considerably less wear on the dicing tool (e.g., saws, dicing wheels, etc.) used in separating the semiconductor wafer.

Further, the absence of auxiliary structures in the kerf may reduce the mechanical stress and micro cracks to the semiconductor wafer during chip separation. As a result of this reduction of stress and damage the quality of sidewalls formed from a chip separation process may be improved.

While in the embodiment disclosed with respect to FIG. 2 the mask layer is shown to be removed subsequent to the removal of kerf auxiliary structures, this is not necessarily so. In some exemplary embodiments the mask layer may be removed later, such as after further processing of the semiconductor wafer. For example, the mask layer may remain during deposition of additional materials and/or during patterning of the semiconductor wafer, or may be removed after chip separation.

One or more exemplary embodiments relate to a method for processing a semiconductor wafer, including: providing a semiconductor wafer including at least one chip and at least one kerf region adjacent to the at least one chip, the kerf region including at least one auxiliary structure; applying a mask layer to the semiconductor wafer; removing the at least one auxiliary structure in the at least one kerf region; and separating the semiconductor wafer along the at least one kerf region.

According to an exemplary embodiment, the applied mask layer is removed before separating the semiconductor wafer and after removing the at least one auxiliary structure.

According to an exemplary embodiment, the at least one auxiliary structure includes a plurality of layers.

According to an exemplary embodiment, at least one layer of the at least one auxiliary structure is a metal layer.

According to an exemplary embodiment, at least one layer of the at least one auxiliary structure is an oxide layer.

According to an exemplary embodiment, at least one layer of the at least one auxiliary structure is a nitride layer.

According to an exemplary embodiment, at least one layer of the at least one auxiliary structure is a carbon layer.

According to an exemplary embodiment, at least one layer of the at least one auxiliary structure is a poly-silicon layer.

According to an exemplary embodiment, the at least one auxiliary structure includes a process control monitor structure.

According to an exemplary embodiment, the at least one auxiliary structure includes a lithographic structure.

According to an exemplary embodiment, the at least one auxiliary structure includes an alignment structure.

According to an exemplary embodiment, the at least one auxiliary structure includes a metal pad.

According to an exemplary embodiment, the at least one auxiliary structure includes a contact for electrochemical etching.

According to an exemplary embodiment, removing the at least one auxiliary structure includes etching at least one layer of the at least one auxiliary structure.

According to an exemplary embodiment, etching includes wet etching the at least one layer of the at least one auxiliary structure.

According to an exemplary embodiment, etching includes dry etching the at least one layer of the at least one auxiliary structure.

According to an exemplary embodiment, the mask layer is a hard mask.

According to an exemplary embodiment, the mask layer is a photoresist.

According to an exemplary embodiment, the mask layer is a positive or negative photoresist.

According to an exemplary embodiment, the mask layer is applied to the front-side of the wafer.

According to an exemplary embodiment, the at least one kerf region is free from the applied mask layer.

According to an exemplary embodiment, the applied mask layer is formed by spray coating masking material on the at least one chip of the semiconductor wafer.

According to an exemplary embodiment, the applied mask layer covers the whole semiconductor wafer.

According to an exemplary embodiment, the applied mask layer is formed by spin coating the semiconductor wafer with masking material.

According to an exemplary embodiment, the at least one auxiliary structure is removed prior to the separation of the semiconductor wafer.

According to an exemplary embodiment, the at least one auxiliary structure is removed subsequent to the separation of the semiconductor wafer.

According to an exemplary embodiment, the at least one auxiliary structure is removed from the front side of the wafer and the semiconductor wafer is separated from the front side of the wafer.

According to an exemplary embodiment, the at least one auxiliary structure is removed from the front side of the wafer and the semiconductor wafer is separated from the back side of the wafer.

According to an exemplary embodiment, the mask layer is applied to the back side of the semiconductor wafer, the semiconductor wafer is separated by dicing the back side of the wafer until just below or before the at least one auxiliary structure, and the at least one auxiliary structure is removed from the front side of the wafer.

According to an exemplary embodiment, separating the semiconductor wafer includes dicing the semiconductor wafer along the at least one kerf region.

According to an exemplary embodiment, dicing the semiconductor wafer along the at least one kerf region includes plasma etching the at least one kerf region.

According to an exemplary embodiment, dicing the wafer along the at least one kerf region includes irradiating the at least one kerf region with a laser.

According to an exemplary embodiment, dicing the wafer along the at least one kerf region includes sawing the at least one kerf region.

According to an exemplary embodiment, dicing the wafer along the at least one kerf region includes sawing the at least one kerf region with a dicing wheel.

According to an exemplary embodiment, dicing the wafer along the at least one kerf region includes stealth dicing the wafer along the at least one kerf region.

According to an exemplary embodiment, removing the at least one auxiliary structure does not damage semiconductor material of the semiconductor wafer adjacent to the at least one auxiliary structure.

One or more exemplary embodiments relate to a method for processing a semiconductor wafer, including: providing a semiconductor wafer including a plurality of integrated circuit chips with kerf regions located at least one of adjacent to and between the integrated circuit chips, the kerf regions including one or more auxiliary structures; applying a mask layer to the integrated circuit chips of the semiconductor wafer; removing the auxiliary structures in the kerf regions; and separating the semiconductor wafer into individual integrated circuit chips.

A method for processing a semiconductor wafer in accordance with various embodiments may include: providing a semiconductor wafer including a plurality of integrated circuit chips with kerf regions located at least one of adjacent to and between the integrated circuit chips, the kerf regions including one or more auxiliary structures; applying a mask layer to the semiconductor wafer; removing the auxiliary structures in the kerf regions without causing damage to semiconductor material of the semiconductor wafer adjacent to the one or more auxiliary structures; and removing the applied mask layer.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A method for processing a semiconductor wafer, the method comprising:
   providing a semiconductor wafer including at least one chip and at least one kerf region adjacent to the at least one chip, the kerf region including at least one auxiliary structure, the at least one auxiliary structure comprising a metal layer and a second layer at least partially surrounding the metal layer, the second layer being different from the metal layer and disposed on the semiconductor wafer;
   applying a mask layer to the semiconductor wafer;
   selectively removing the at least one auxiliary structure in the at least one kerf region so as to remove at most a negligible amount of semiconductor material of the semiconductor wafer between the at least one chip and the at least one auxiliary structure,
   wherein selectively removing the at least one auxiliary structure comprises removing the metal layer and the second layer; and
   separating the semiconductor wafer along the at least one kerf region.

2. The method of claim 1, further comprising removing the applied mask layer before separating the semiconductor wafer and after removing the at least one auxiliary structure.

3. The method of claim 1, wherein the at least one auxiliary structure comprises a plurality of layers.

4. The method of claim 1, wherein the at least one auxiliary structure comprises a process control monitor structure.

5. The method of claim 1, wherein the at least one auxiliary structure comprises a lithographic structure.

6. The method of claim 1, wherein the at least one auxiliary structure comprises an alignment structure.

7. The method of claim 1, wherein the at least one auxiliary structure comprises a metal pad.

8. The method of claim 1, wherein the at least one auxiliary structure comprises a contact for electrochemical etching.

9. The method of claim 2, wherein removing the at least one auxiliary structure comprises etching at least one layer of the at least one auxiliary structure.

10. The method of claim 9, wherein etching comprises wet etching the at least one layer of the at least one auxiliary structure.

11. The method of claim 9, wherein etching comprises dry etching the at least one layer of the at least one auxiliary structure.

12. The method of claim 1, wherein the mask layer comprises a hard mask.

13. The method of claim 1, wherein the mask layer comprises a photoresist.

14. The method of claim 1, wherein the mask layer is applied to the front-side of the wafer.

15. The method of claim 1, wherein the at least one kerf region is free from the applied mask layer.

16. The method of claim 1, wherein separating the semiconductor wafer comprises dicing the semiconductor wafer along the at least one kerf region.

17. The method of claim 16, wherein dicing the semiconductor wafer along the at least one kerf region comprises plasma etching the at least one kerf region.

18. The method of claim 16, wherein dicing the wafer along the at least one kerf region comprises irradiating the at least one kerf region with a laser.

19. The method of claim 16, wherein dicing the wafer along the at least one kerf region comprises sawing the at least one kerf region.

20. The method of claim 16, wherein dicing the wafer along the at least one kerf region comprises stealth dicing the wafer along at least one kerf region.

21. The method of claim 1, wherein removing the at least one auxiliary structure does not damage semiconductor material of the semiconductor wafer adjacent to the at least one auxiliary structure.

22. A method for processing a semiconductor wafer, the method comprising:
   providing a semiconductor wafer including a plurality of integrated circuit chips with kerf regions located at least one of adjacent to and between the integrated circuit chips, the kerf regions including one or more auxiliary structures, wherein each of the one or more auxiliary structures comprises a metal layer and a second layer at least partially surrounding the metal layer, the second layer being different from the metal layer and disposed on the semiconductor wafer;
   applying a mask layer to the integrated circuit chips of the semiconductor wafer;
   selectively removing the auxiliary structures in the kerf regions so as to remove at most a negligible amount of semiconductor material of the semiconductor wafer between the plurality of integrated circuit chips and the one or more auxiliary structures,
   wherein selectively removing each of the auxiliary structures comprises sequentially removing the metal layer and the second layer; and
   separating the semiconductor wafer into individual integrated circuit chips.

23. A method for processing a semiconductor wafer, the method comprising:
   providing a semiconductor wafer including a plurality of integrated circuit chips with kerf regions located at least one of adjacent to and between the integrated circuit chips, the kerf regions including one or more auxiliary structures,
   wherein each of the one or more auxiliary structures comprises a metal layer and a second layer at least partially surrounding the metal layer, the second layer being different from the metal layer and disposed on the semiconductor wafer;
   applying a mask layer to the semiconductor wafer;
   selectively removing the auxiliary structures in the kerf regions without causing damage to semiconductor material of the semiconductor wafer between the plurality of integrated circuit chips and the one or more auxiliary structures,
   wherein selectively removing each of the auxiliary structures comprises sequentially removing the metal layer and the second layer; and
   removing the applied mask layer.

24. The method of claim 1, wherein subsequent to selectively removing the at least one auxiliary structure in the at least one kerf region, a surface of the semiconductor wafer in the kerf region located adjacent to the at least one chip is completely exposed.

25. The method of claim 1, removing the metal layer and the second layer comprises sequentially removing the metal layer and the second layer.

* * * * *